(12) United States Patent
Strackx et al.

(10) Patent No.: US 10,985,788 B2
(45) Date of Patent: Apr. 20, 2021

(54) FULL DUPLEX TRANSMISSION ARRANGEMENT

(71) Applicant: Nokia Solutions and Networks Oy, Espoo (FI)

(72) Inventors: Maarten Strackx, Westmeerbeek (BE); Brecht Francois, Ghent (BE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 16/829,605

(22) Filed: Mar. 25, 2020

(65) Prior Publication Data

US 2020/0313704 A1    Oct. 1, 2020

(30) Foreign Application Priority Data

Mar. 29, 2019  (EP) .................................... 19166260

(51) Int. Cl.
| | | |
|---|---|---|
| *H04B 1/04* | (2006.01) | |
| *H03F 1/56* | (2006.01) | |
| *H04L 25/02* | (2006.01) | |

(52) U.S. Cl.
CPC .......... *H04B 1/0458* (2013.01); *H03F 1/565* (2013.01); *H04L 25/0266* (2013.01); *H04L 25/0272* (2013.01)

(58) Field of Classification Search
None
See application file for complete search history.

(56) References Cited

U.S. PATENT DOCUMENTS

| | | | | |
|---|---|---|---|---|
| 6,400,616 B1* | 6/2002 | Tamura | ................ | G11C 7/1051 365/198 |
| 6,606,483 B1* | 8/2003 | Baker | ................... | H03F 1/0277 455/126 |
| 8,265,571 B2* | 9/2012 | Adler | ..................... | H04B 1/406 455/83 |
| 8,666,338 B2* | 3/2014 | Zhao | ....................... | H03F 3/195 455/127.1 |
| 9,455,669 B2* | 9/2016 | Modi | ...................... | H03F 3/245 |
| 9,503,025 B2* | 11/2016 | Cao | .......................... | H03F 1/565 |
| 10,079,671 B2* | 9/2018 | Sjoland | .................. | H04B 1/525 |
| 2011/0068873 A1* | 3/2011 | Alidio | .................. | H03F 1/3247 330/295 |
| 2011/0236027 A1* | 9/2011 | Nosaka | .............. | H03F 3/45475 398/135 |

(Continued)

*Primary Examiner* — Lana N Le
(74) *Attorney, Agent, or Firm* — Harness, Dickey & Pierce, P.L.C.

(57) ABSTRACT

The present document discloses a transmission arrangement for coupling an amplifier to a transmission medium. An input node of the amplifier is couplable to a transmitter and an output node of the amplifier is couplable to a terminal of the transmission medium. The transmission arrangement may comprise a first branch coupled between the input node of the amplifier and an intermediate node which is couplable to a receiver. The transmission arrangement may further comprise a second branch coupled between the output node of the amplifier and the intermediate node. In particular, the first branch comprises a first capacitive element, while the second branch comprises a second capacitive element. Furthermore, at least one of the first and second branches further comprises a phase matching circuit coupled in series with the respective capacitive element.

17 Claims, 9 Drawing Sheets

(56) References Cited

U.S. PATENT DOCUMENTS

| | | | | |
|---|---|---|---|---|
| 2013/0307616 A1* | 11/2013 | Berchtold | ............ | H03F 1/0227 330/127 |
| 2014/0266432 A1* | 9/2014 | Scott | ............ | H03H 7/09 330/149 |
| 2015/0311871 A1* | 10/2015 | Ide | ............ | H03F 1/3211 398/212 |
| 2015/0365052 A1* | 12/2015 | Barton | ............ | H03F 3/19 330/295 |
| 2016/0181987 A1* | 6/2016 | Perreault | ............ | H03F 1/0205 330/251 |
| 2016/0336957 A1* | 11/2016 | Bernardinis | ............ | H03K 7/08 |
| 2017/0146591 A1* | 5/2017 | Nobbe | ............ | G01R 31/2856 |
| 2018/0123634 A1* | 5/2018 | Settaf | ............ | H03F 3/24 |

* cited by examiner

FULL DUPLEX TRANSMISSION ARRANGEMENT

CROSS-REFERENCE TO RELATED APPLICATIONS

This present application claims priority under 35 U.S.C. § 119 to European Patent Application No. EP 19166260.0, filed Mar. 29, 2019, in the European Patent Office, the entire contents of which are hereby incorporated by reference.

TECHNICAL FIELD

The present document relates to a transmission arrangement for full duplex communication systems. In particular, the present document relates to a transmission arrangement for full duplex operations utilizing the directivity of an amplifier of the full duplex communication system.

BACKGROUND

In general, full duplex refers to operations that simultaneously use identical frequencies and without time-interleaving for data transmission on a single medium in two directions (i.e., downstream and upstream). However, full duplex operation may be particularly challenging if the undesired echo signal of the transmit signal dominates over the desired receive signal, i.e., the echo signal is much larger than the desired receive signal and hence dominates the analog ADC (Analog-to-digital converter) operation settings. In fact, if the echo would not be taken into account, the ADC would be saturated by the echo signal. Even with an ideal ADC, echo suppression cannot be done completely in the digital domain, because transmitter noise and distortion will also leak into the near-end receiver through the echo channel.

Therefore, it is important to suppress the echo signal as much as possible in the analog domain. Accordingly, a circuit commonly known as a "hybrid" may be used. Typically, the "hybrid" is introduced in the Analog Front End (AFE). In general, the "hybrid" acts as a three-port network with a transmit port, a receive port and a line port which are respectively coupled to a (local) transmitter, a (local) receiver and a line/transmission medium (e.g., a coaxial cable, a twisted pair). While both the transmission (Tx) and reception (Rx) signal may be present on the line port, isolation between the Tx and Rx is very important and determines the amount of echo. As indicated above, the local transmitted signal needs to be isolated towards the local receiver, in order to avoid saturation of the receiver amplifier chain which is typically not designed to directly handle the amount of power that the transmitter delivers to the line.

Consequently, the hybrid is generally designed to suppress the immediate signal from the (local) transmitter to the (local) receiver. Its performance may depend on the matching to the characteristic impedance of the transmission medium. However, reflections occurring along the transmission medium cannot be easily distinguished from the desired Rx signal and can therefore not be suppressed by the analog hybrid. In most practical cases, the immediate echo dominates. On top of this functional requirement of signal isolation, the hybrid circuit would be beneficial to be realized with low loss, low noise and wideband (across a wide frequency range of e.g. 1.2 GHz or even more) properties.

SUMMARY

In view of some or all of the above problems (and use cases), the present disclosure proposes a hybrid design which has some or all of the above characteristics.

Generally speaking, the present disclosure proposes to place the hybrid connection (arrangement) across the amplifier's input and output nodes, rather than in between amplifier output and the line (transmission medium). Configured as such, the proposed arrangement can achieve a theoretically 0 dB loss structure with improved wider bandwidth support, which is also suitable for practical implementation.

As a broad aspect, there is provided a transmission arrangement for coupling an amplifier to a transmission medium. In some cases, this transmission arrangement may also be (collectively) referred to as the "hybrid" or the "hybrid circuit" as illustrated above. As will be appreciated by the skilled person, in some technologies (e.g., DSL, G.fast and/or cable technologies) the amplifier may be implemented as a line driver, whereas in some other technologies the amplifier may be implemented in some other manners. In particular, the amplifier may comprise an input node and an output node. More particularly, the input node of the amplifier is couplable to a transmitter whereas the output node of the amplifier is couplable to a terminal (one end) of the transmission medium. Notably, as will be appreciated by the skilled person, the term "couplable" does not necessarily require a direct connection between two nodes in a circuit and may also mean that a path exists between the two nodes which may involve one or more other circuit components or the like. That is to say, the transmitter (which is typically not part of the transmission arrangement or amplifier itself) may be coupled (directly or indirectly) to the input node of the amplifier in order to provide input transmit signal(s), which would eventually reach a peer receiver at a far end of the transmission medium. The input signal(s) from the transmitter may be amplified by the amplifier and output onto the output node for transmission over the transmission medium. On the other hand, the transmission medium may be implemented e.g., as Unshielded Twisted Pairs (UTP) or TV broadcast coaxial cables, depending on different technologies. Further, the output node of the amplifier and the terminal of the transmission medium (which are coupled together) may be further couplable to a local receiver. The receiver and the transmitter may be comprised within the same transceiver device, as will be appreciated by the skilled person.

In particular, the transmission arrangement comprises a first (transmission) branch coupled between the input node of the amplifier and an intermediate node. The intermediate node is couplable to the receiver. Further, the transmission arrangement also comprises a second (transmission) branch coupled between the output node of the amplifier and the intermediate node. Thus, in other words, the transmission arrangement is coupled across the amplifier's input and output nodes.

Moreover, the first branch comprises a first capacitive element whereas the second branch comprises a second capacitive element. Yet further, at least one of the first and second branches further comprises a phase matching circuit coupled in series with the respective first or second capacitive element. In other words, the phase matching circuit is comprised within either the first branch or the second branch, or even both branches, depending on circumstances. In particular, the phase matching circuit may be placed in front of the (first or second) capacitive element (e.g., from the amplifier's point of view), or vice versa. In other words, in some cases, the phase matching circuit may be placed closer towards the (input or output nodes of the) amplifier and the capacitive element may be placed closer towards the intermediate node. In some other cases, the arrangement of the phase matching circuit and the first capacitive element may be switched (swapped). Notably, the first and second capacitive elements may be as simple as capacitors or any other suitable circuit components as will be appreciated by the skilled person. Broadly speaking, by adapting the configurations of the components in the first and second branches, the transmit signals passing through the first and second branches respectively achieve substantially identical magnitudes but substantially opposite phases (polarities) at the intermediate node, such that the transmit signals can be (almost) cancelled out. Preferably, the amplifier provides a first phase shift between its input and output signals and the phase matching circuit provides a second phase shift so that both phase shifts together produce the opposite phases (180 degree) of the signals through both branches at the intermediate node.

Configured as such, the input and output nodes of the amplifier (e.g., the line driver) are utilized for achieving a full duplex transmission arrangement, i.e., coupling both the transmitter and the receiver with the transmission medium, while at the same time achieving (signal) isolation between the transmitter and the receiver. That is to say, the transmission arrangement is placed across the amplifier's input and output nodes, rather than in between amplifier output and the transmission medium. In particular, the transmission arrangement (connections) is placed on nodes which typically have a low impedance, due to the amplifier matching requirements. Therefore, the capacitance introduced by the transmission arrangement will be of less influence on the isolation bandwidth, compared to connecting it to a high impedance node like e.g., inside the feedback network or inside the amplifier. Consequently, the amplifier can be directly connected to the transmission medium without any lossy series resistance as is usually the case with a typical hybrid design. Furthermore, the amplifier's directivity property of having high inherent reverse isolation can also be exploited. Additionally, the phase matching circuit placed in one of the transmission arrangement branches can effectively compensate for the phase response and gain roll-off at high frequencies introduced by the amplifier. Consequently, the phase matching circuit can help to extend the range of the isolation bandwidth, e.g. from 100 MHz up to even 2 GHz.

In some examples, the phase matching circuit may be configured to achieve (nearly) opposite signal phases within a frequency range at the intermediate node between transmit signals passing through the first branch and the second branch. As will be appreciated by the skilled person, normally perfect opposite signal phases can be achieved at one frequency. In some cases, it is even possible to achieve (perfect) opposite signal phases may be for multiple frequency points. However, for most of the bandwidth, the phase may typically be nearly opposite. Generally speaking, the transmission arrangement provides two versions of the transmitter signal, namely one version before the amplifier (i.e., passing through the first branch) and another version after the amplifier (i.e., passing through the amplifier and then the second branch). The phase matching circuit may then be configured to cause the two versions of transmitter signal to be (nearly) opposite in phase at the intermediate node. As will be appreciated by the skilled person, the phases of the two versions of signal at the intermediate node which pass through the first and second braches respectively do not have to be exactly the opposite (i.e., 180 degree in phase) and also may be opposite (only) in a certain frequency range, typically the communication frequency range or a substantial part thereof.

Due to the existence of the amplifier (e.g., the line driver), the two versions of the transmit signal may further show a scaled fixed (over time) difference in magnitude. Depending on different circumstances, the difference in signal magnitude may not be mandatory. In order to achieve better isolation at the intermediate node towards the receiver, in some examples, a ratio between capacitances of the first capacitive element and the second capacitive element may be determined according to a gain of the amplifier (or loss if the amplifier is a driver having no gain). For instance, in some cases, the ratio between the capacitance of the first capacitive element and the capacitance of the second capacitive element may be set to correspond (e.g., be equal or almost equal) to the amplifier gain value. Configured as such, the transmission signals passing through the first branch and the second branch may be cancelled out at the intermediate node, thereby achieving signal isolation at the receiver.

In some examples, the phase matching circuit may simply comprise a resistive element. The resistive element may be as simple as a resistor or any other suitable circuit components as will be appreciated by the skilled person. Consequently, the resistive element may be coupled in series with the first capacitive element.

In some examples, both the resistive element and at least one of the first and second capacitive elements may be tunable elements. That is to say, depending on circumstance and requirements, the resistance of the resistive element as well as the capacitance of the first and/or second capacitive element may be tuned. For example, if the resistive element (the phase matching circuit) is comprised within the first branch, then the resistive element and the first capacitive element are tunable elements. Similarly, if the resistive element (the phase matching circuit) is comprised within the second branch, then the resistive element and the second capacitive element are tunable elements. Such tuning operation may be achieved digitally or in any other suitable manner as will be appreciated by the skilled person.

In some examples, the resistive element and the first capacitive element may be tuned in accordance with the amplifier gain and/or amplifier load. For instance, the tuning may be performed to match a ratio between capacitances of the first capacitive element and the second capacitive element according to amplifier gain and/or amplifier load. In particular, depending on the load of the amplifier, both magnitude and phase via the first and second branches can differ from case to case. Therefore, a tunable first capacitive element may be preferred to be able to change ratio of capacitances, in order to compensate for the change in amplifier gain. Furthermore, a tunable resistive element (acting as the phase matching circuit) may also be preferred (or required) for re-compensating the change in the phase response. Introducing the tunability in the first (input) branch may be preferred because of the lower RF power levels at the first branch (compared to the second branch). At the output of the amplifier, a large signal is typical present, which may additionally complicate the design of tuning switches in terms of linearity. The second (output) branch may also be directly connected to the amplifier output thus any additional loss introduced here, would result in a loss of received signal power. However, it is generally not excluded or prohibited that tunability may also be introduced in the second branch of the transmission arrangement.

In some examples, the transmission arrangement may operate in a single-ended configuration or in a differential configuration. In particular, in the differential configuration, the first branch and the second branch of the transmission arrangement may each comprise a pair of differential signal lines for carrying a respective pair of differential signals. As will be understood and appreciated by the skilled person, in the differential configuration, the input node of the amplifier may be considered to comprise two separate terminals/pins, namely an inverting terminal/pin (commonly indicated as $-V_{IN}$ or simply "−") and a non-inverting terminal/pin (commonly indicated as $+V_{IN}$ or simply "+"), for receiving respective differential input signals that are transmitted by the transmitter. Similarly, the output node of the amplifier may also comprise two separate terminals/pins (i.e., $-V_{OUT}$ and $+V_{OUT}$) for outputting the signals to the transmission medium and also passing through the second branch of the transmission arrangement (towards to the receiver). In order to provide reversed signal phases (polarities), one signal line of the differential signal lines of the first branch may be connected with the "+" input terminal of the amplifier and the corresponding signal line of the second branch which is connected thereto at the intermediate node is connected with the "−" output terminal of the amplifier. The other signal line of the first branch may then be connected with the "−" input terminal of the amplifier and the corresponding signal line of the second branch is connected with the "+" output terminal of the amplifier. This provides a reversal of the signals on the differential lines on the input versus the output side of the amplifier, which corresponds to a 180 degree phase shift of the signals. In this case, the phase matching circuit needs only to adapt the signal phases caused by amplifier or other circuit artefacts.

Naturally, the receiver may also comprise two separate terminals/pins which are coupled to the intermediate node. In this sense, the intermediate node may be considered to have two pins (or "sub-nodes") that can be coupled with the respective pins of the receiver.

Given the differential configuration, the first and second branches of the transmission arrangement may each comprise a pair of differential signal lines for carrying a respective pair of differential signals. Accordingly, each line of the pair of differential signal lines in the first branch may comprise a respective first capacitive element and each line of the pair of differential signal lines in the second branch may comprise a respective second capacitive element. Moreover, each line of the pair of differential signal lines in the at least one of the first and second branches may comprise a respective phase matching circuit. In other words, the phase matching circuit (e.g., the simple resistive element), the first capacitive element and the second capacitive element may be duplicated/replicated on each of the two lines in the respective pair of differential signal lines in order to achieve good balancing and common mode rejection performances.

In some other cases of the differential configuration, some other (more generic) forms of the phase matching circuit may be implemented, such that duplication of the phase matching circuit (e.g., the simple resistive element) on each signal line may not be necessary. For instance, a type of circuit called all-pass lattice filter may be exploited as the phase matching circuit which may typically not affect the transfer function magnitude, but only the phase. By way of illustration without limitation, a possibly suitable implementation of the all-pass lattice filter may comprise a respective resistor (or a resistive element) and a respective inductor (or an inductive element) which are coupled in series between the input node of the amplifier and the respective first capacitive element on each of the pair of differential signal lines. Furthermore, the all-pass lattice filter may also comprise a respective capacitor (or a capacitive element) which is cross-coupled between the respective first capacitive element on one differential signal line and the input node of the amplifier on the other differential signal line. Configured as such, low in-band frequencies may be passed without phase adjustment, while a phase roll-off is introduced at the higher frequencies. Introducing a series inductance with a series resistor allows the impedance to increase across the band, which may further improve the high frequency isolation. Also, by introducing the cross coupling capacitors, an additional degree of freedom to modify the phase response may be utilized.

In some examples, the intermediate node may act as a virtual ground. This virtual ground configuration at the intermediate node (which is coupled to the receiver) may improve the hybrid operation. In particular, the virtual ground concept can prevent the incoming Rx signal from entering the first branch of transmission arrangement. This will otherwise result in loss of the receiver input signal and possibly in unstable amplifier operation (positive feedback).

In some examples, the at least one of the first and second branches comprising the phase matching circuit and the first capacitive element may further comprise a pre-amplification stage which is coupled between the first capacitive element and the phase matching circuit. Of course, the additional gain and phase roll-off introduced by this pre-amplification stage should be considered by the phase matching circuit. That is to say, in some cases, the ratio between capacitances of the first capacitive element and the second capacitive element may be determined further according to the gain of the pre-amplification stage. For instance, depending on the closed loop gain of the pre-amplification stage, the capacitance of the first capacitive element may be reduced (smaller). Configured as such, the capacitive division ratio (i.e., the ratio between capacitances of the first and second capacitive elements) may be affected (e.g., reduced) and the open loop gain requirements of the receiver input amplifier as illustrated above may be relaxed. In particular, the pre-amplifier of the pre-amplification stage may only partially amplify the input signal, thereby relaxing the receiver requirements, without the need of e.g., creating a replica of the transmitted signal or driving the same (large) load. Therefore, the pre-amplification stage can be designed with lower power consumption and large bandwidth support. Furthermore, the pre-amplification stage can also result in area saving (of the circuit) and make the components of the transmission arrangement easier to match to each other.

In summary, by using the amplifier input and output nodes and by compensating the scaling between both branches by introducing a ratio between the capacitances rather than some other inefficient manner e.g., using a power-hungry replica line driver, the present disclosure has numerous advantages, such as using low impedance nodes, resulting in a larger isolation bandwidth (e.g., compared to using a node in the line driver feedback network). Furthermore, by avoiding using additional active elements (e.g., transistors) in the transmitter chain, the performance of the maximum amplifier output power or the amplifier linearity can be improved.

According to another broad aspect, there is provided an integrated circuit (IC) which comprises a transmission arrangement according to the examples as illustrated above. In other words and as will be appreciated by the skilled person, the transmission arrangement is embedded within the IC which may comprise other circuit component(s).

In particular, in some examples, IC or the transmission arrangement itself may be implemented using CMOS technologies. As will be appreciated by the skilled person, the CMOS technologies typically allows for dense integration and enables tuning capabilities and co-design of the amplifier (e.g., liner driver) and the hybrid arrangement in a single well-known environment. Additionally, the IC and/or the transmission arrangement may also be implemented using any suitable on-die (silicon based) processes, such as CMOS bulk, CMOS SOI, SiGE BICMOS, or using III-V processes such GaAs, GaN, or any other suitable processes. Generally speaking, the transmission arrangement may be integrated on the same chip/package as the amplifier (e.g., liner driver) with the help of these technologies. In other embodiments, this is however not necessary and the transmission arrangement need not be integrated at all.

According to yet another broad aspect, there is provided a network node comprising a transmission arrangement according to the examples as illustrated above. By way of illustration and not limitation, depending on different circumstances and technologies, the network node can be an access node, such as a Cable Modem Termination System (CMTS), a Distribution Point Units (DPU), or a wireless base station (e.g., an eNodeB, an access point, etc.), etc. Alternatively, the network node can be a subscriber equipment, such as a DSL or G.fast or cable modem, a laptop, a smartphone, etc.

Implementations of the disclosed apparatuses may include using, but not limited to, one or more processor, one or more application specific integrated circuit (ASIC) and/or one or more field programmable gate array (FPGA). Implementations of the apparatus may also include using other conventional and/or customized hardware such as software programmable processors.

It will be appreciated that device/apparatus features may be interchanged in many ways. In particular, the details of the disclosed devices can be implemented as a method and vice versa, as the skilled person will appreciate. In addition, the above aspects may be combined in many ways, even if not explicitly disclosed. The skilled person will understand that these combinations of aspects and features/steps are possible unless it creates a contradiction which is explicitly excluded.

Other and further embodiments of the present invention will become apparent during the course of the following discussion and by reference to the accompanying drawings.

BRIEF DESCRIPTION OF THE FIGURES

Embodiments of the disclosure are explained below in an exemplary manner with reference to the accompanying drawings, wherein FIG. 1 schematically illustrates an exemplary system with two transceivers communicating in full duplex.

DETAILED DESCRIPTION

Generally speaking, the proposed transmission arrangement can be used for coupling an amplifier to a transmission medium in a full duplex communication system.

Figure 1:
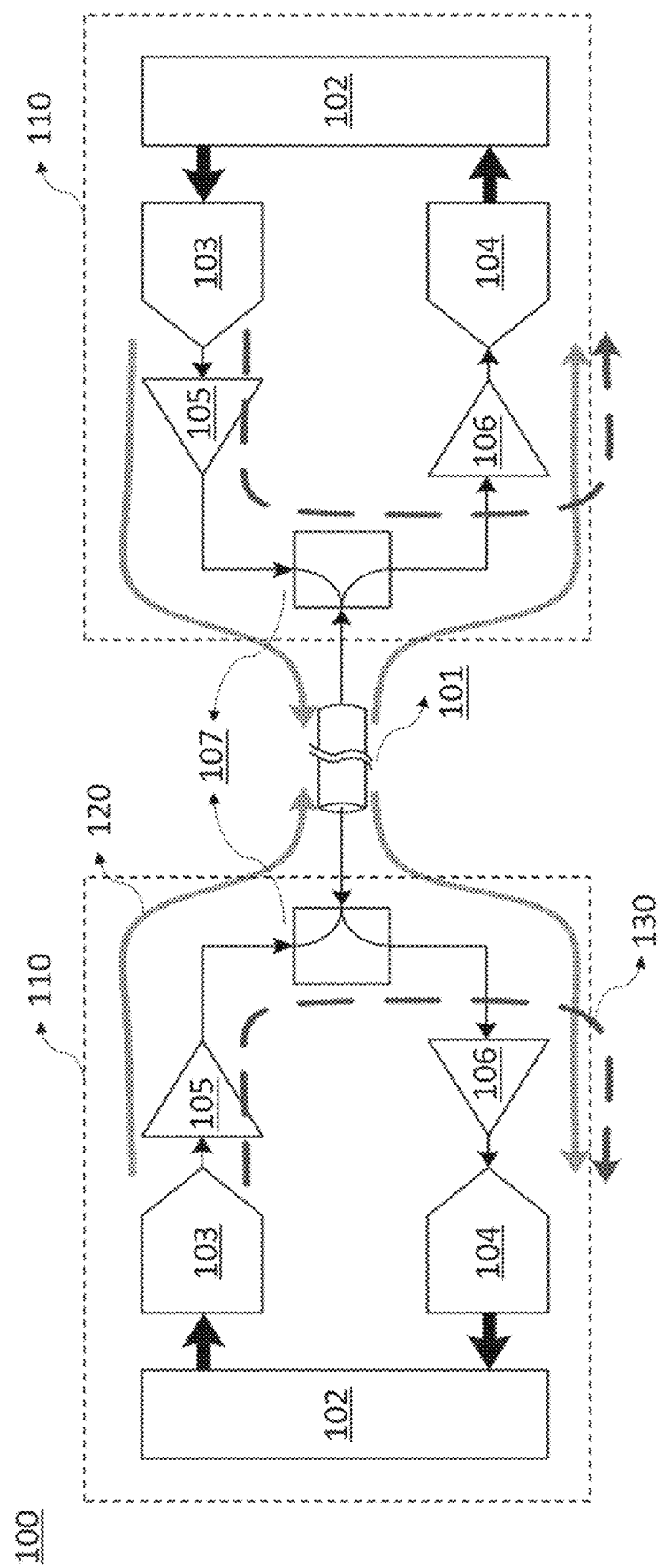

FIG. 1 schematically illustrates an exemplary system with two transceivers communicating in full duplex. In particular, the full duplex communication system 100 comprises two transceivers 110 communicating with each other through a channel (transmission medium) 101. Typically, the transceiver 110 comprises a digital front end (DFE) entity/unit 102. On the transmit chain, the transceiver 110 further comprises a digital-to-analog converter (DAC) 103 and an amplifier (e.g., a line driver) 105. On the receive chain, the transceiver 110 further comprises an analog-to-digital converter (ADC) 104 and a low noise amplifier (LNA) 106. The receive chain and the transmit chain are coupled through a hybrid entity (or a hybrid circuit) 107 towards the channel 101. Generally, the desired communication signal is transmitted from the transmitter of one transceiver 110 through the transmission medium 101 and received by the receiver of the other transceiver 110, as indicated by the solid arrows 120 of FIG. 1. However, due to the leakage of the transmitter noise and distortion into the near-end receiver, undesired echo signal is generated. Since the echo signal (from the near-end transmitter) is typically much larger than the desired receive signal, the echo signal may dominate the analog ADC operation settings and would even saturate the ADC, if the echo would not be taken into account. Referring to FIG. 1, the (undesired) echo signal is indicated as dashed arrows 130.

Therefore, it is important to suppress the echo signal as much as possible. In particular, it is desirable to design a transmission arrangement (hybrid circuit) which is of low loss, low noise and suitable for wideband operation (e.g., operating across a wide frequency range of 1.2 GHz or even more). Moreover, it is also desirable that the transmission arrangement circuit technique can apply to any full duplex technology, e.g., full duplex DSL or cable technologies, as well as full duplex Ethernet or full duplex wireless radio technologies.

Figure 2:
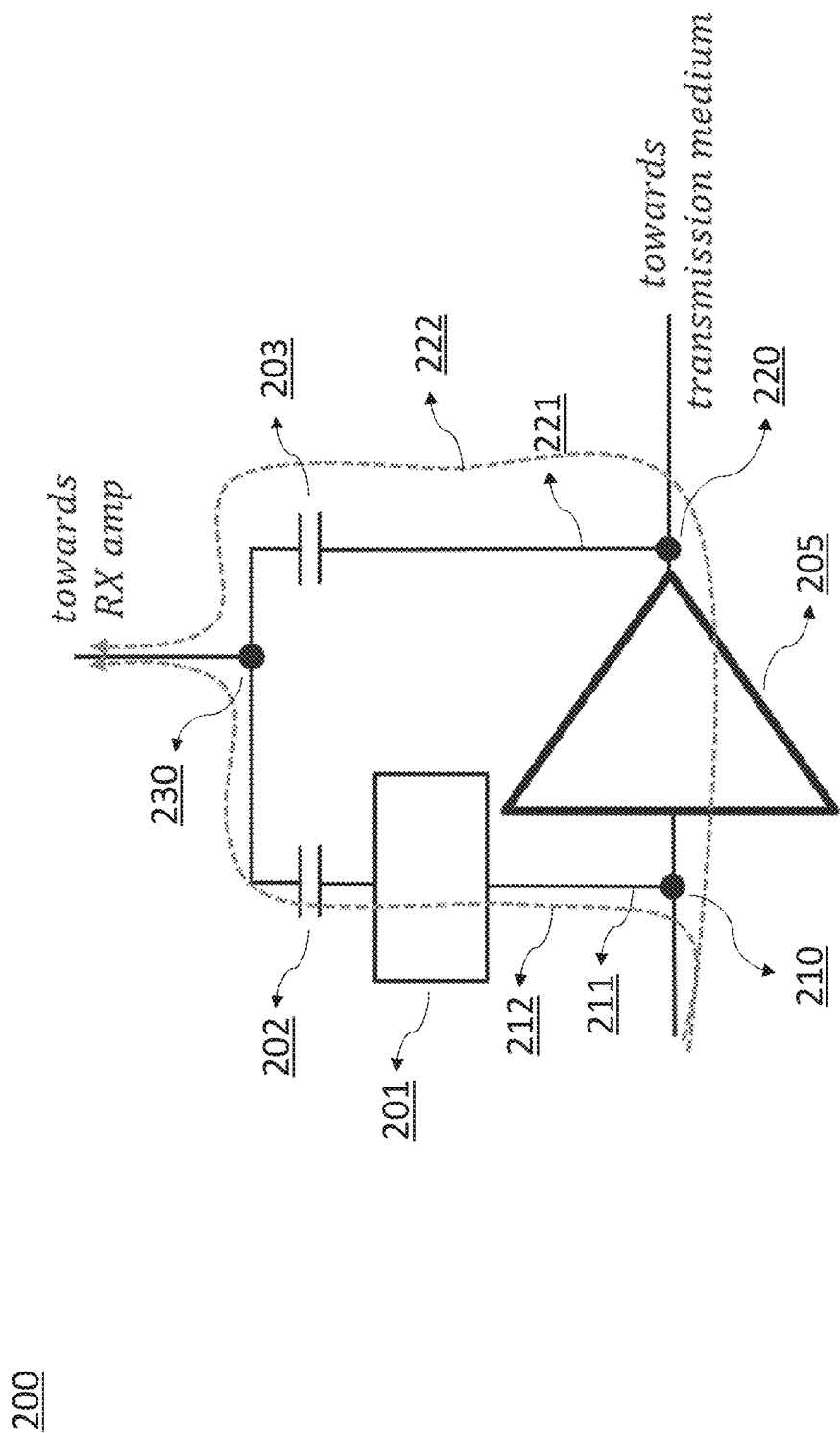
FIG. 2 schematically illustrates an exemplary transmission arrangement according to an embodiment of the present invention.

FIG. 2 schematically illustrates an exemplary transmission arrangement according to an embodiment of the present invention. The transmission arrangement may be used to couple an amplifier 205 to a transmission medium (e.g., the channel 101 in FIG. 2). In particular, the amplifier 205 may have an input node 210 which is couplable to a (local) transmitter (not shown in FIG. 2) of a transceiver device (e.g., the transceiver 110 of FIG. 1). On the other side, the amplifier 205 may have an output node 220 which is couplable to the transmission medium. Preferably, the amplifier is an inverting amplifier which provides a phase reversal of its output versus its input. In this case, the amplifier output signal has a 180 degree phase shift, at least for a portion of its frequency bandwidth. The transmission arrangement may comprise a first branch 211 which is coupled between the input node 210 of the amplifier 205 and an intermediate node 230 and a second branch 221 between the output node 220 of the amplifier 205 and the intermediate node 230. In some cases, the first and second branch may be also referred to as the input branch or the output branch, respectively. The intermediate node 230 may be couplable to a (local) receiver (not shown in FIG. 2) of the (same) transceiver device, possibly through a receiver amplifier (e.g., the low noise amplifier 106 in FIG. 1).

More particularly, in the example as shown in FIG. 2, the first branch 211 comprises a first capacitive element (e.g., a capacitor) 202 and a phase matching circuit 201 coupled in series. The phase matching circuit 201 together with the phase response of the amplifier 205 provide for a phase reversal of the signals of the first branch 211 and the second branch 221 produced by the transmitter when adding at the intermediate node 230. This allows these signals to be cancelled as discussed below. Preferably, the amplifier 205 exhibits signal directivity and allows signals only to pass from its input to its output and not vice versa. Further, the second branch 221 comprises a second capacitive element (e.g., a capacitor). However, it should be understood that the phase matching circuit 201 be comprised within the first branch 211 is merely one possible example and that in some other cases the phase matching circuit 201 can be switched to the second branch 221 or even be placed on both the first branch 211 and the second branch 221.

In some cases (e.g. when implementing the transmission arrangement in CMOS technologies), placing the phase matching circuit 201 in the first branch 211 is the less complex approach. However, in other cases, the phase matching circuit 201 may be arranged in the second branch 221 even though this solution is a bit more complex. In the latter case, the node at the output of the amplifier (e.g. a line driver) is typically high voltage; hence, the components placed at that node need to be designed to withstand a higher voltage swing, which for some technologies, is not so much an issue and not a big challenge. Further, having a larger swing might result in slightly lower linearity performance. Finally, small extra losses may be expected to the receiver since more components are placed in the second branch to overcome some challenges with the higher output voltage. However, the performance difference will be small in some technologies. As mentioned above, phase matching circuits may be even introduced in both branches which allows more complex phase matching and/or distributing partial phase matching across both branches.

It is also to be noted that since the transmission arrangement may generally act as a hybrid circuit for coupling the (local) transmitter and the (local) receiver to the transmission medium as illustrated above, the transmitter and the receiver as well as the amplifier 205 itself may generally not form part of the transmission arrangement. However, as will be appreciated by the skilled person, these components may be comprised within the same integrated circuit (IC) possibly together with other circuit components (e.g., ADC, DAC, etc.).

Generally speaking, the transmission arrangement (hybrid circuit) is introduced in the AFE, which couples both local transmitter and local receiver to the line, while providing isolation between both. As illustrated above, the local transmitted signal needs to be isolated towards the local receiver, to avoid saturation of the receiver amplifier chain, which is not designed to directly handle the amount of power that the transmitter delivers to the line.

In order to achieve this functionality, and generally applicable, two versions of the transmitter (TX) signal that can cancel each other need to be available. In reference to FIG. 2, signals at the input node 210 and output node 220 of the amplifier 205 caused by the transmitter may be described as $x_{1TX}(t)$ and $x_{2TX}(t)$, respectively. Assuming the amplifier 205 as an (ideal) inverting amplifier, then $x_{2TX}(t)$ may be consider to be exactly 180 degree out of phase with respect to $x_{1TX}(t)$ (i.e., $\sphericalangle x_{1TX}(t)=-\sphericalangle x_{2TX}(t)$). Further, due to the gain of the amplifier 205, $x_{2TX}(t)$ may have a scaled magnitude with respect to $x_{1TX}(t)$ (i.e., $|x_{2TX}(t)|=\alpha|x_{1TX}(t)|$, with $\alpha$ being the gain of the amplifier 205). Therefore, in order to achieve (optimal) signal isolation towards the receiver, a scaled addition can be performed on the two versions of signal $x_{1TX}(t)$ and $x_{2TX}(t)$, such that the transmitter signal may be (completely or substantially) cancelled out at the intermediated node 230. In other words, assuming the signal at the intermediate node 230 to be described as $y_{TX}(t)$, then $y_{TX}(t)=\beta x_{1TX}(t)+x_{2TX}(t)$. Naturally, if $\alpha$ could be set to be equal $\beta$, then $y_{TX}(t)$ would be 0, which basically means that (ideal) isolation could be achieved at the intermediate node 230 towards the receiver. In some cases, both $\alpha$ and $\beta$ may be chosen to be less than or equal 1, such that the circuit can be realized with passive components without gain. However, signal loss may be introduced by choosing $\alpha$ to be less than or equal 1.

In some technologies, such as DSL, where the output power is typically limited to 4 dBm or 8 dBm depending on the profile, losing a substantial amount of power in the hybrid, say 50% may not have been the primary point of concern because the amplifiers (e.g., line drivers) may be efficient. However, considering the line driver efficiency which has been reduced from VDSL onwards due to the bandwidth increase, omitting the hybrid loss may become significant. Moreover, due to the increased bandwidth, line drivers may be biased in their linear operation mode (e.g., class A or class AB) and their efficiency may be reduced to only a few percent. Omitting the hybrid loss, can be expected to reduce the line driver power consumption e.g., by around 250 mW per line.

In some other technologies, such as cable technologies, the problem may even more severe, where about 30 dBm is delivered to the line and line driver power consumption numbers can be in the order of 20-30 W per line. Consequently, saving e.g., 50% of power loss here, already corresponds to 10 W per line. Thus, reducing power loss by the hybrid may become a concern.

Only for the sake of completeness, if the received signal (from a distant far-end transmitter) on nodes 210 and 220 would be present in the same ratio as the local transmitter signal, then also the received signal would be cancelled out in the same way. Therefore, directivity should be present in a hybrid circuit, i.e., a distinction needs to be in place between the local transmitter signal and the signal being received from the line. Let $x_{1RX}(t)$ and $x_{2RX}(t)$ be the signals on nodes 210 and 220 caused by the incoming signal from the line, the $|x_{1RX}(t)|=\gamma|x_{2RX}(t)|$, and $\sphericalangle x_{1RX}(t)=-\sphericalangle x_{RX}(t)$. Consequently, signal $y_{RX}(t)$ at the intermediate node 230 would equal to $-\beta\gamma x_{2RX}(t)+x_{2RX}(t)$. As can be seen in the above equations, the incoming received signal would be attenuated as well, in case both nodes contain a version of the received signal. Notably, due to reciprocity, opposite polarity of the received signal on nodes 210 and 220 was assumed here.

Now referring to FIG. 2, by using the line driver input and output nodes 210 and 220 for achieving a full duplex transmission arrangement, i.e., coupling both transmitter and receiver with the transmission medium, isolation between the transmitter and receiver can be achieved. In particular, the transmission arrangement is placed across the input and output nodes 210 and 220 of the amplifier 205, rather than in between amplifier output 220 and the transmission medium or inside the amplifier feedback or inside the amplifier 205 itself. The transmission arrangement is placed on nodes which have a low impedance, due to the line driver matching requirements. Therefore, capacitance introduced by the transmission arrangement will be of less influence on the isolation bandwidth, compared to connecting it to a high impedance node like inside the feedback network or inside the amplifier 205. Consequently, the amplifier 205 can be directly connected to the line without any lossy series resistance as would be usually the case. The amplifier directivity property of having high inherent reverse isolation is also exploited.

Figure 5B:
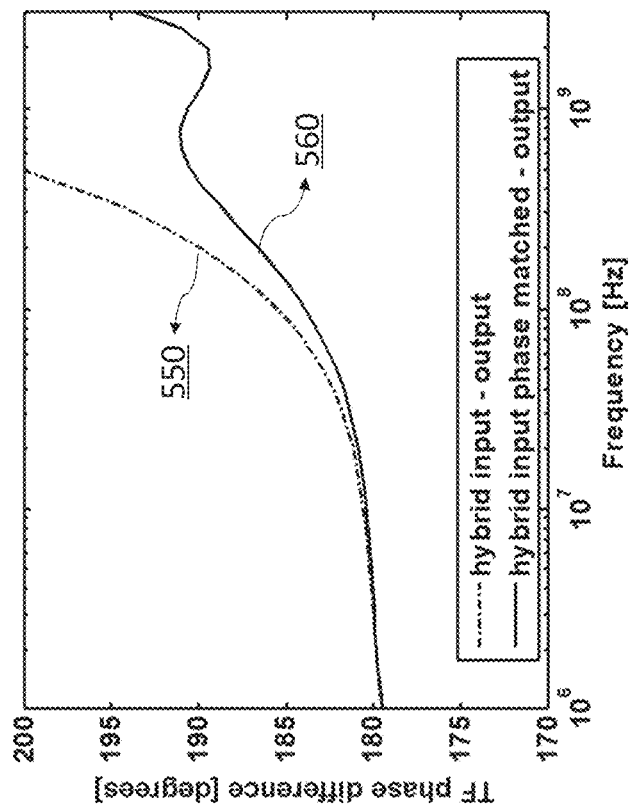
FIGS. 5A-5C schematically illustrate simulation results of the transmission arrangement according to the embodiment of FIG. 4 of the present invention.
Figure 5A:
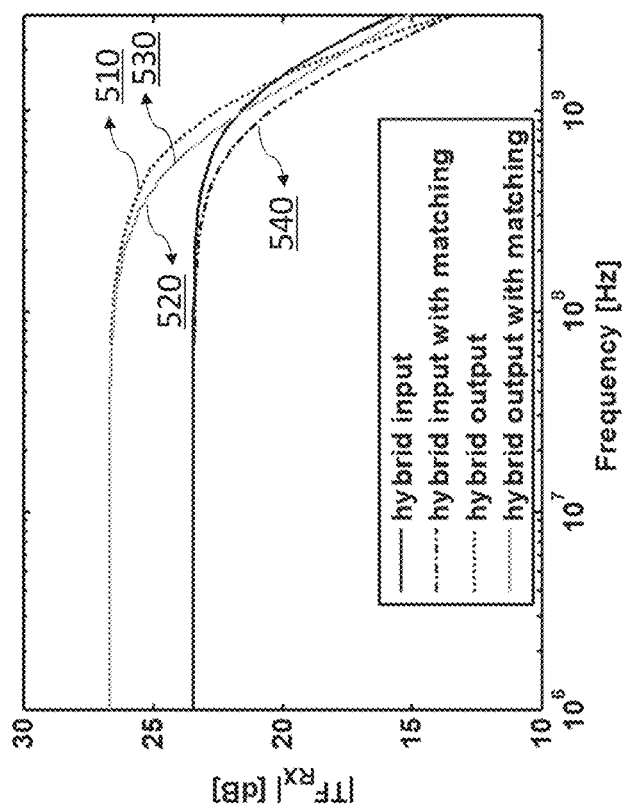
Figure 5C:
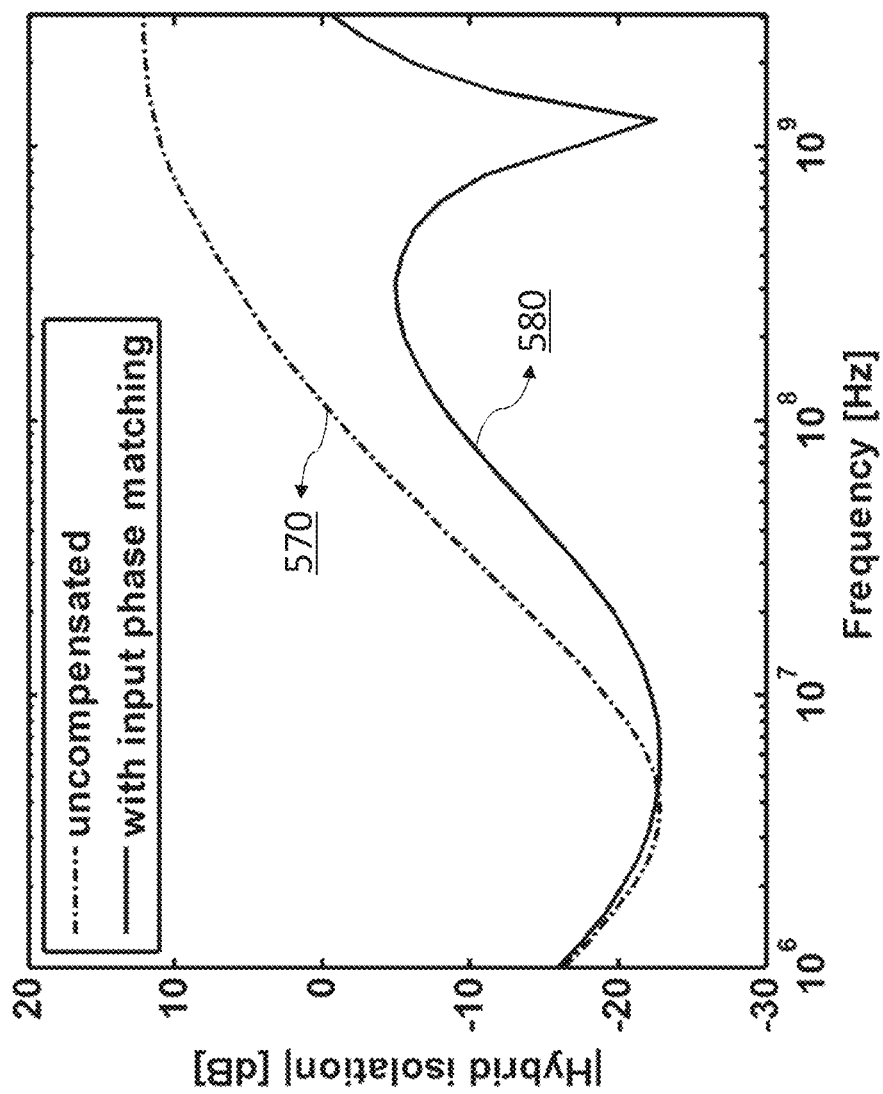

Furthermore, in order to achieve a wide isolation bandwidth (e.g., up to 1.2 GHz), the phase matching circuit 201 is introduced in at least one of the branches 211 and 221, which effectively compensates for the amplifier's phase response and gain roll-off at higher frequencies. In particular, the phase matching circuit 201 enables to create an exact (or substantial) 180 degree of phase difference at the intermediate node 230 between (transmit) signals passing through the first path 212 and the second path 222. Therefore, the phase matching circuit 201 not only compensates for the amplifier phase roll-off, but also takes the loading effect of the capacitive element 202 on the path (first branch 211) into account. Notably, the introduced phase matching circuit 201 can extend the isolation bandwidth from 100 MHz, to even 2 GHz according to circuit simulations as shown in FIGS. 5A-5C which will be illustrated later.

Moreover, considering the gain of the amplifier 205, the ratio β as illustrated above is introduced between the first capacitive element 202 and the second capacitive element 203. That is to say, assuming the first capacitive element 202 having a capacitance of C1 and the second capacitive element 203 having a capacitance of C2, in the example as shown in FIG. 2, C2 is set to be equal to β×C1.

Figure 3:
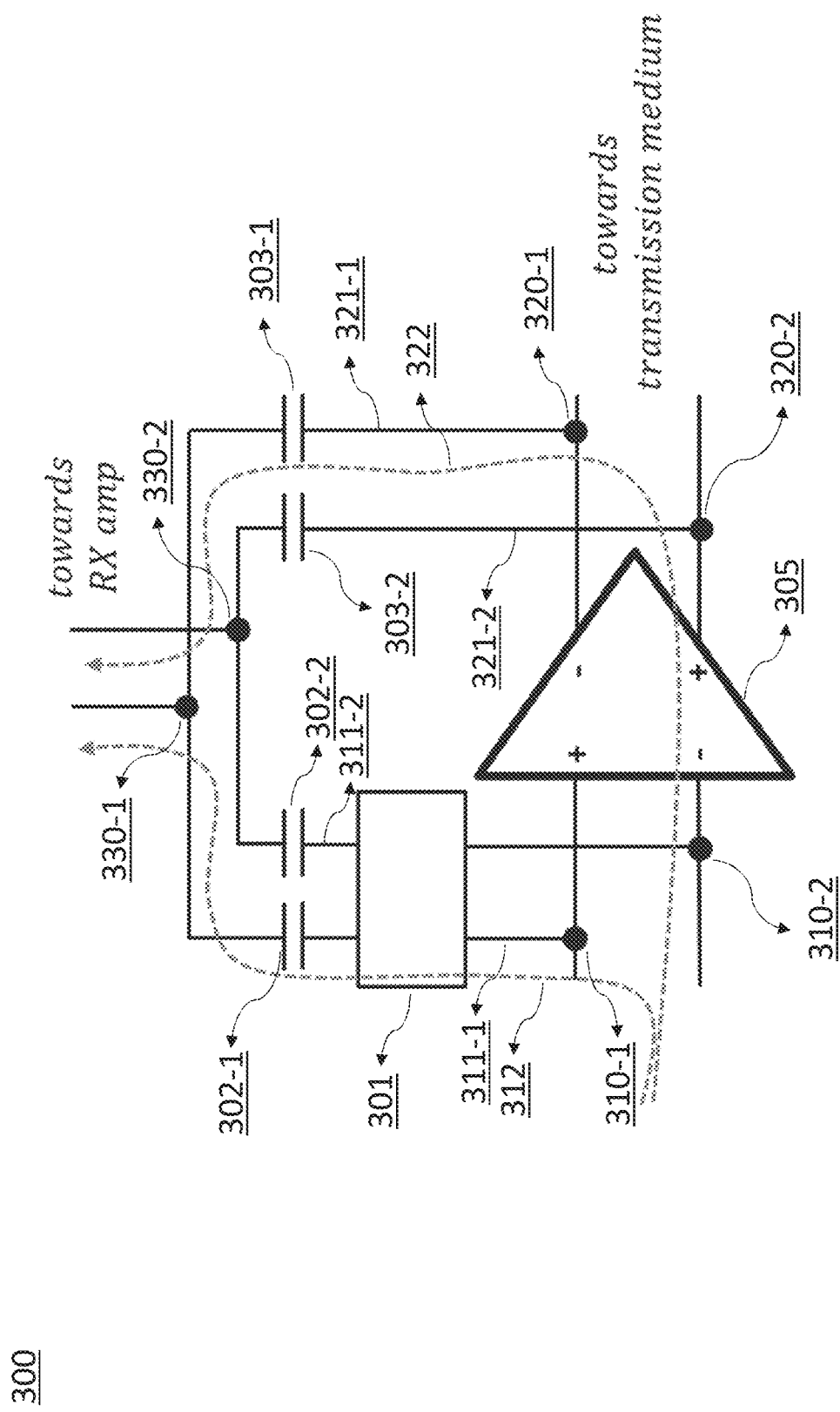
FIG. 3 schematically illustrates an exemplary transmission arrangement in a differential configuration according to an embodiment of the present invention.

As will be appreciated by the skilled person, deadening on circumstances and/or requirements, the transmission arrangement (e.g., the transmission arrangement as shown in FIG. 2) may operate either in a single-ended configuration or in a differential configuration. FIG. 3 schematically illustrates a possible differential configuration according to an embodiment of the present invention. Notably, like reference numbers in FIG. 3 indicate like or similar elements in FIG. 2, such that repeated description thereof may be omitted for reasons of conciseness. In particular, compared to the transmission arrangement as shown in FIG. 2, the amplifier 305 in FIG. 3 may be considered to comprise two separate pins/(sub-)nodes, namely an inverting node 310-2 (indicated as "−") and a non-inverting node 310-1 (indicated as "+"), for receiving respective differential input signals that are transmitted by the transmitter. Similarly, the output node of the amplifier may also be considered to comprise two separate pins/(sub-)nodes (i.e., 320-1 and 320-2, respectively) for outputting the signals to the transmission medium and also passing through the second branch of the transmission arrangement (towards the receiver). Naturally, the receiver may also comprise two separate terminals/pins which are coupled to the intermediate node. In this sense, the intermediate node may also be considered to have two pins (or "sub-nodes") 330-1, 330-2 that can be coupled with the respective pins of the receiver.

Accordingly, the first and second branches 311 and 312 of the transmission arrangement may each comprises a pair of differential lines for carrying a respective pair of differential signals. For simplicity, in FIG. 3, the pairs of differential lines of the first and second branches 311 and 312 are shown as two separated lines 311-1, 311-2 and 312-1, 312-2, respectively.

For each of the lines in the pair of differential signal lines 311-1 and 311-2 of the first branch, a respective first capacitive element 302-1, 302-2 is provided. In some cases, the respective first capacitive elements 302-1, 302-2 on both lines 311-1 and 311-2 may be exactly the same element. In some other cases, respective first capacitive elements 302-1, 302-2 on both lines 311-1 and 311-2 may of different forms but exhibit the same capacitance, as will be appreciated by the skilled person. Similarly, for each of the lines in the pair of differential signal lines 312-1 and 312-2 of the second branch, a respective second capacitive element 303-1, 303-2 is provided.

Furthermore, in the example as shown in FIG. 3, a single phase matching circuit 301 is provided across the differential signal lines 311-1 and 311-2 of the first branch. However, as will be appreciated by the skilled person, depending on different implementation of the phase matching circuit, a respective phase matching circuit (e.g., as 301-1, 301-2) may be provided on each line of the pair of differential signal lines 311-1 and 311-2.

Figure 4:
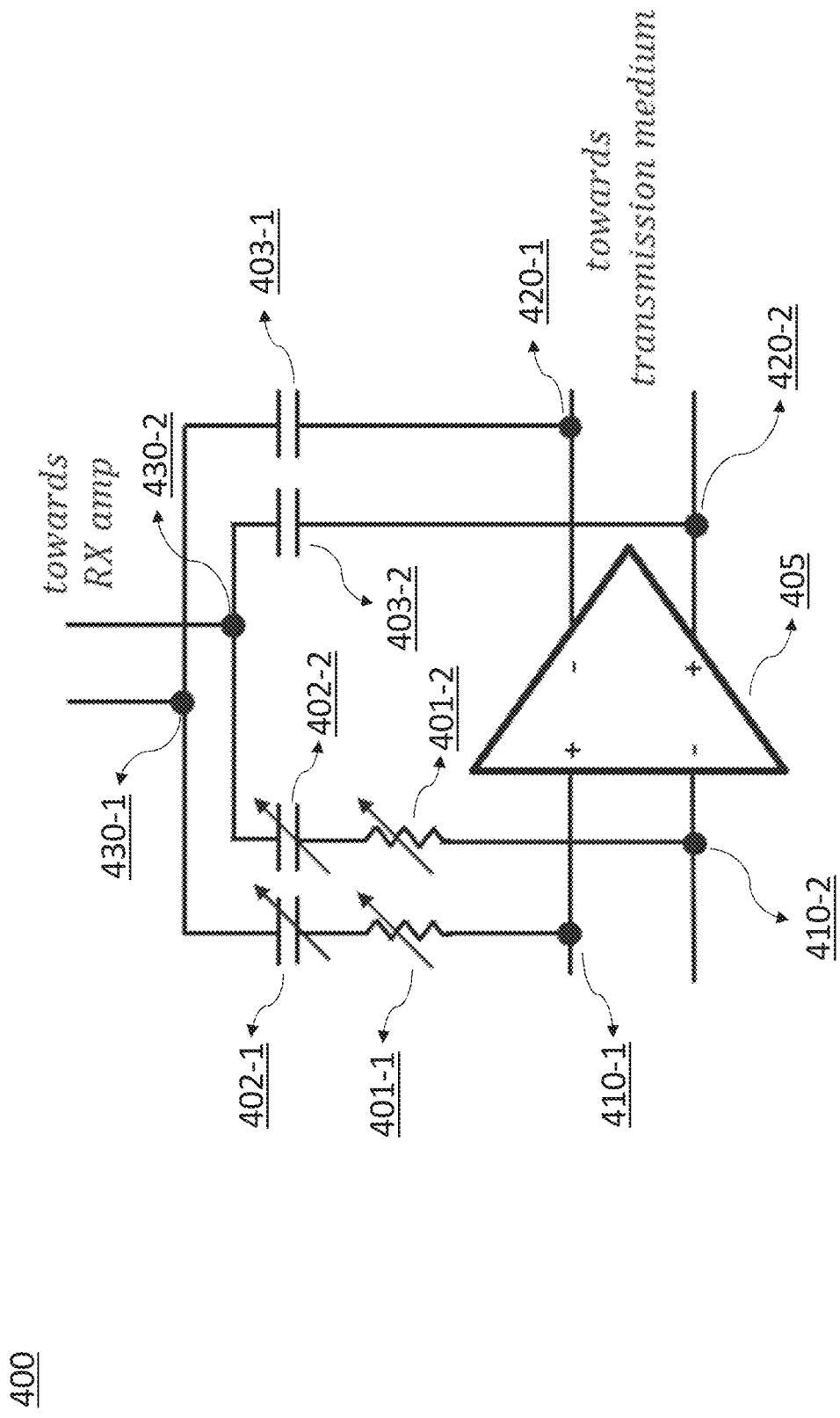
FIG. 4 schematically illustrates another exemplary transmission arrangement in a differential configuration according to an embodiment of the present invention.

FIG. 4 schematically illustrates a further exemplary transmission arrangement in a differential configuration according to an embodiment of the present invention. Notably, like reference numbers in FIG. 4 indicate like or similar elements in FIG. 3, such that repeated description thereof may be omitted for reasons of conciseness. In particular, as shown in FIG. 4, the phase matching circuit 401 is implemented as simple as a respective resistive element 401-1, 401-2. Depending on circumstances and/or requirements, it may be desirable that tunable (e.g., digitally) components are used for the resistive element 401-1, 401-2 and/or the first capacitive element 402-1, 402-2. Depending on the amplifier load, both magnitude and phase of signals via the paths (e.g., paths 312, 322 of FIG. 3) can differ from case to case. Therefore, a tunable first capacitive element may be preferred to be able to change the ratio p, to compensate the change in amplifier gain. Furthermore, a tunable resistive element may be preferred for re-compensating the (changed) phase response. Introducing the tunability in the first branch is typically preferred because of the lower RF power levels compared to the second branch. At the amplifier output, a large signal is typically present, which would additionally complicate the design of the tuning switches (e.g., in terms of linearity). Also, the output branch is typically directly connected to the amplifier output and any additional loss introduced here may result in a loss of received signal power.

FIGS. 5A-5C schematically illustrate simulation results of the transmission arrangement according to the embodiment of FIG. 4 of the present invention.

For comparison, the circuit as shown in FIG. 4 is simulated twice. The two paths (corresponding to the first and second branches of the transmission arrangement) are simulated separately, while taking the loading effect of the other into account. In particular, FIG. 5A shows the transfer functions of from the amplifier input and output nodes 410, 420 to the intermediate node 430. More particularly, from up to bottom, the curves in FIG. 5A represent the transfer function 510 of the second branch without the phase matching circuit 401, the transfer function 520 of the second branch with the phase matching circuit 401, the transfer function 530 of the first branch without the phase matching circuit 401, and the transfer function 540 of the first branch with the phase matching circuit 401, respectively. FIG. 5A generally shows the gain matching property, which is set by ratio β. As can be seen from FIG. 5A, introducing R1 has no impact on the gain, but does affect the roll-off frequency and phase response as desired.

On the other hand, FIG. 5B shows phase difference between the first and second branches. In particular, the upper curve 550 represents the phase difference without the phase matching circuit 401, while the lower curve 560 represents the phase difference with the phase matching circuit 401. As can be seen from FIG. 5B, by introducing the phase matching circuit 401 (e.g., the resistive elements 401-1, 401-2), the phase difference is kept closer to 180 degrees across a larger bandwidth.

Finally, FIG. 5C shows the TX-RX isolation performance of the transmission arrangement, with both paths connected towards the RX amplifier. In particular, the upper curve 570 represents the isolation without the phase matching circuit 401, while the lower curve 580 represents the isolation with the phase matching circuit 401. As can be seen from FIG. 5C, the 0 dB isolation bandwidth is effectively extended from 100 MHz to 2 GHz.

Note that the amplifier gain is still included in this simulation results. This means that the actual hybrid suppression is 26 dB lower (see FIG. 5A). These results are achieved using a simulator with an actual amplifier (line driver) based on transistor models in 22 nm CMOS. Also, the receiver amplifier is assumed to be ideal, for illustrative purposes only.

In the example of FIG. 4, a simple R-series phase compensation is described. Although the amplifier is typically based on transistor circuit models, the amplifier load is assumed to be real (resistive) only. Therefore, a more generic circuit implementation, e.g., a so-called all-pass lattice filter which typically does not affect the transfer function magnitude, but only the phase may be desired.

Figure 6:
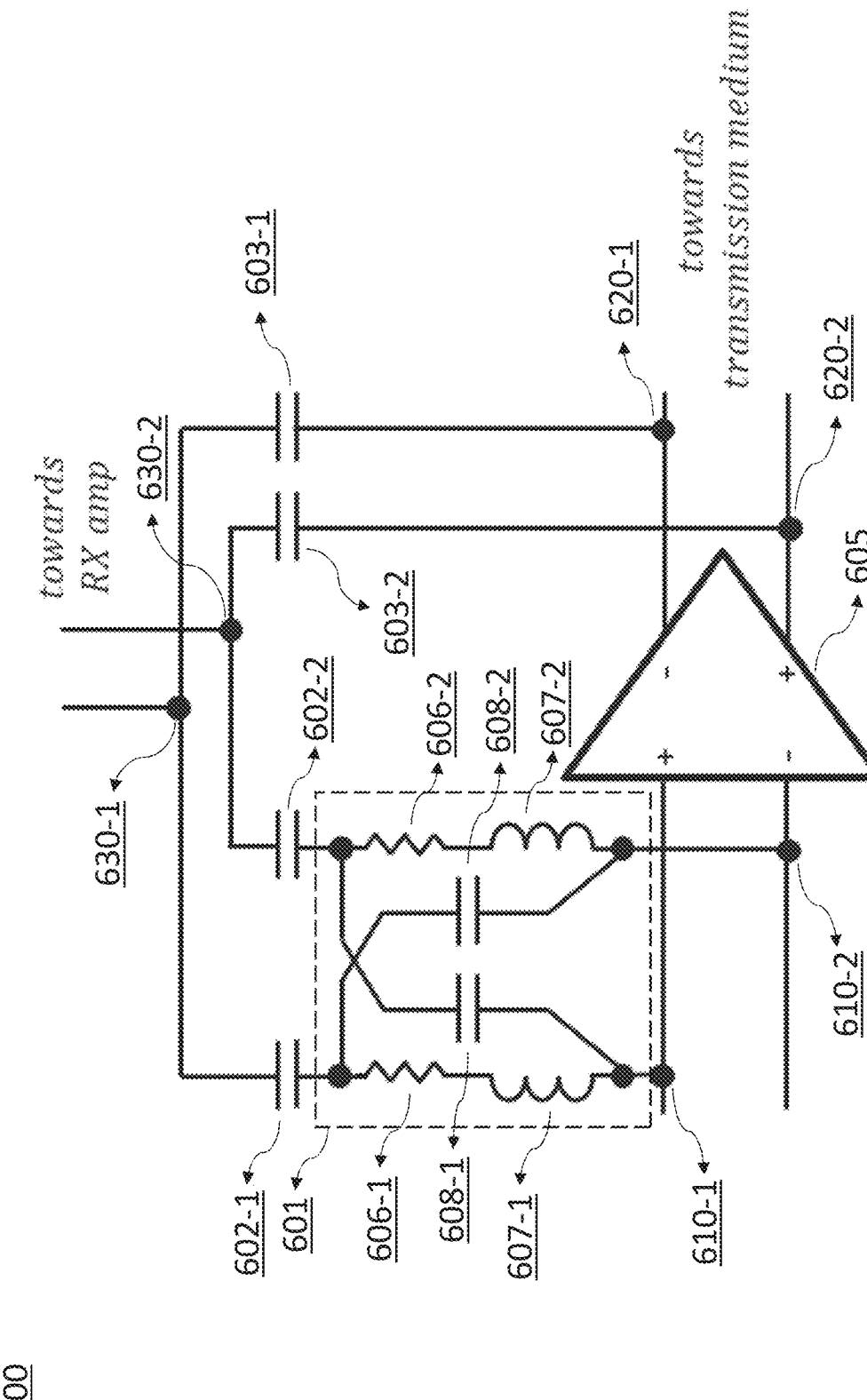
FIG. 6 schematically illustrates another exemplary transmission arrangement in a differential configuration according to an embodiment of the present invention.

While different designs of phase shifter filter can be carried out in practice to enter in the first or second branch, one possible implementation could be an all-pass filter-based phase shifter which is presented in FIG. 6, as an illustration. Notably, like reference numbers in FIG. 6 indicate like or similar elements in FIG. 3, such that repeated description thereof may be omitted for reasons of conciseness. In particular, as shown in FIG. 6, the all-pass lattice filter 601, which acts like the phase matching circuit (e.g. the phase matching circuit 301 of FIG. 3), comprises a respective resistor 606-1 or 606-2 and a respective inductor 607-1 or 607-2 which may be coupled in series between the input node 610-1 or 610-2 of the amplifier 605 and the respective first capacitive element 602-1 or 602-2 on each of the pair of differential signal lines. Furthermore, a respective capacitor 608-1 or 608-2 is provided to be placed across the respective first capacitive element 602-1 or 602-2 on one differential signal line and the input node 610-2 or 610-1 of the amplifier 605 on the other differential signal line.

Configured as such, low in-band frequencies can be passed without phase adjustment, while a phase roll-off can be introduced at the higher frequencies. Introducing a series inductance with the series resistance allows the impedance to increase across the band, which can improve the high frequency isolation. Also, by introducing the cross coupling capacitors 608-1, 608-2, an additional degree of freedom to modify the phase response may be exploited.

For hybrid operation in a full duplex communication system, it may be sometimes desirable that the intermediate node (e.g., the intermediate node 230 of FIG. 2) which is coupled towards the receiver, via one or more components, can act as a virtual ground. The virtual ground concept may help to prevent the incoming Rx signal from entering the transmission arrangement branch with the phase matching circuit (e.g., the resistive element) and the capacitive element. This may otherwise result in loss of the receiver input signal. Assuming that no virtual ground would be present (at the intermediate node) and that only the first and second capacitive elements (simply referred to as C1 and C2 for illustrating purpose) were implemented and a DAC output impedance of 0 Ohm was introduced for ease of reasoning. In such assumed case, the incoming Rx signal may be consider to be passed through a capacitive divider, with C1 being in the order of Av×C2 (where Av is the gain of the amplifier and the parasitic capacitances at the input and output of the amplifier are ignored).

Further assuming a typical value of C1 to be 4 pF and a typical value of C2 to be 160 fF, the loss in the Rx signal could potentially be as high as 28 dB. This back-off-the-envelope reasoning emphasize the importance of having a good virtual ground. The virtual ground may be realized by having a high open loop gain before applying feedback on the receiver input amplifier. However, there is generally a technological limit on the amount of open loop gain that can be achieved with a single amplifier. Therefore, a pre-amplification stage may be introduced to mitigate (reduce) this loss.

Figure 7:
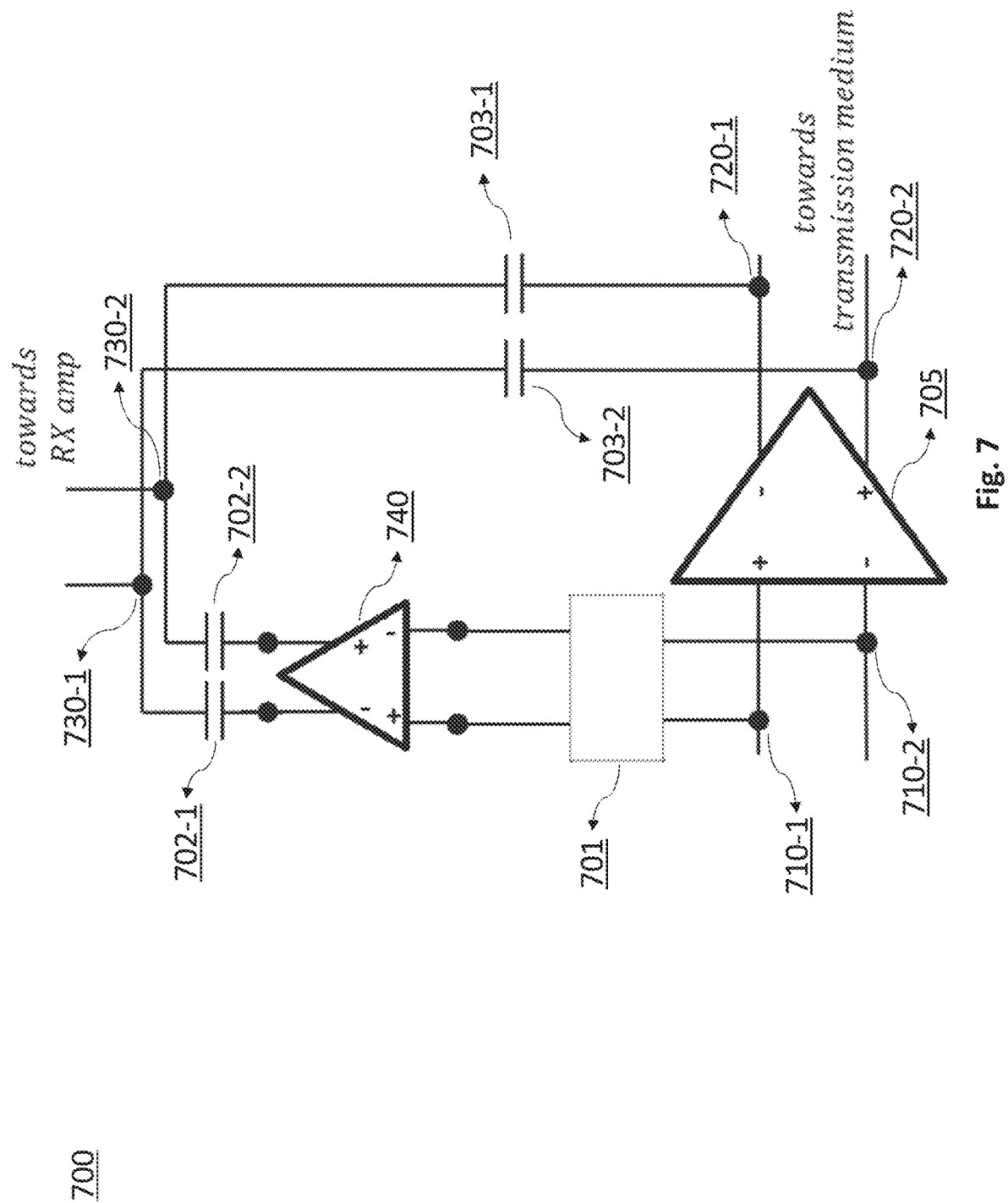
FIG. 7 schematically illustrates yet another exemplary transmission arrangement in a differential configuration according to an embodiment of the present invention.

FIG. 7 schematically illustrates an example of a transmission arrangement with a pre-amplification stage 740 according to an embodiment of the present invention. Notably, like reference numbers in FIG. 7 indicate like or similar elements in FIG. 3, such that repeated description thereof may be omitted for reasons of conciseness. In particular, as can be seen from FIG. 7, the pre-amplification stage is implemented simply as a pre-amplifier 740 placed in between the phase matching circuit 701 and the first capacitive element 702-1, 702-2. As will be appreciated by the skilled person, in practice the pre-amplifier 740 may comprise a (internal) feedback loop (not shown in FIG. 7) e.g. by using a resistor and a capacitor coupled in parallel. In this case, the pre-amplification stage 740 and/or the phase matching circuit 701 may further comprise a capacitor which could be serving as an AC coupling capacitor. Then the closed loop gain of the pre-amplifier 740 may be determined further based on the capacitances of those further capacitors (i.e., the AC coupling capacitor and the feedback capacitor). Configured as such, the ratio between the capacitances of the first and second capacitive elements (simply referred to as C1 and C2 as before) can be reduced, which affects the capacitive division ratio and relaxes open loop gain requirements of the receiver's input amplifier. In particular, apart from the consideration of the gain of the amplifier 705, the reduced value of C1 may be determined in further accordance with the gain of the introduced pre-amplifier 740. Moreover, the pre-amplifier 740 here may only partially amplify the input signal in order to relax receiver requirements. Thus, the pre-amplifier 740 will not create a replica of the transmitted signal, nor will it drive the same load, nor will it consume nearly as much but rather a negligible fraction of the DC power consumed by the amplifier 705. Therefore, the pre-amplifier 740 (or in general the pre-amplification stage) can be designed with support of lower power consumption and large bandwidth. Of course, as illustrated above, the additional gain and phase roll-off from this pre-amplification stage should be considered by the phase matching circuit.

Figure 8:
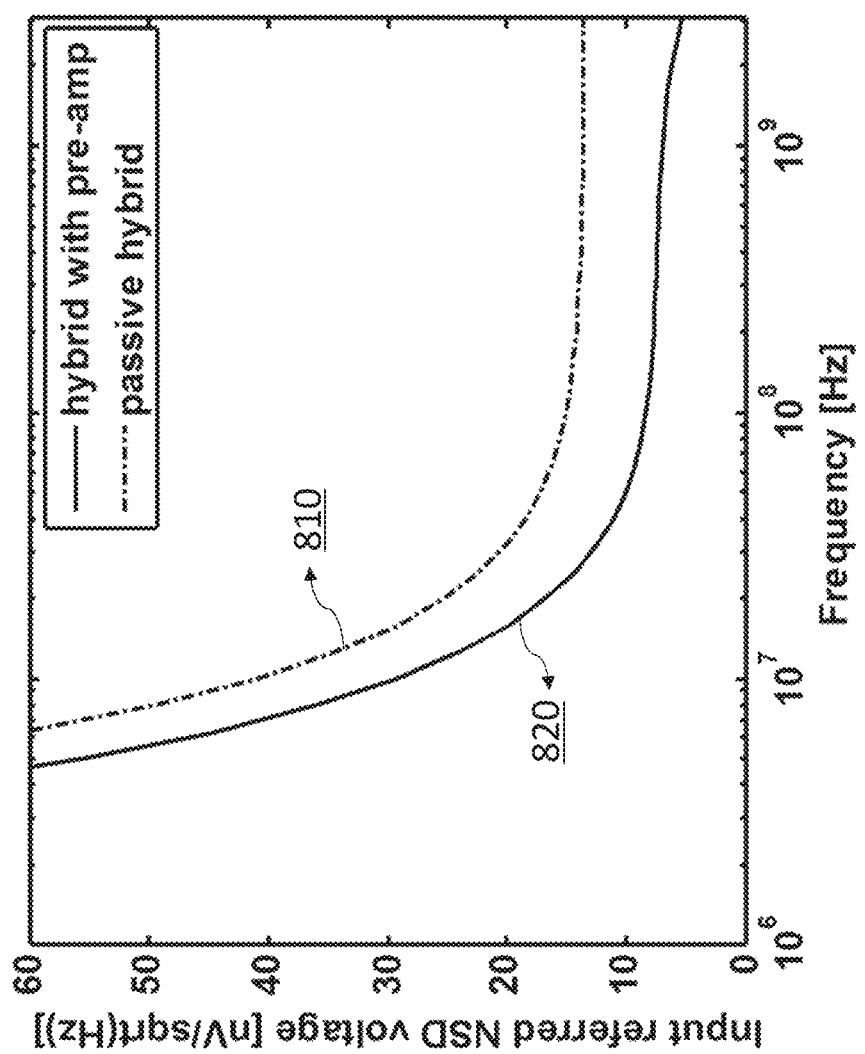
FIG. 8 schematically illustrates simulation results of the transmission arrangement according to FIG. 7 of the present invention.

FIG. 8 schematically illustrates simulation results of the transmission arrangement according to FIG. 7 of the present invention, with improved noise performance. In particular, the dashed curve 810 represents the input referred noise behavior without the pre-amplifier 740 while the solid curve 820 represents the input referred noise behavior with the pre-amplifier 740. As can be seen from FIG. 8, the input referred noise (line referred noise) is reduced from 14 nV/sqrt(Hz) to 7 nV/sqrt(Hz) in the frequency range from 100 MHz to 2 GHz. Notably, the overall larger noise below 10 MHz is due to transistor 1/f noise. As a result, the proposed pre-amplification stage not only improves the noise performances, but also results in area savings, makes the hybrid passives easier to match to each other, relaxes constraints on the receiver amplifier design and reduces losses due to practical implementation.

It is to be noted that the terms "coupled" and "couplable" should not be interpreted as being restricted to direct connections only. Thus, the scope of the expression "a device A coupled to a device B" should not be limited to devices or systems wherein an output of device A is directly connected to an input of device B, and/or vice-versa. It means that there exists a path between an output of A and an input of B, and/or vice-versa, which may be a path including other devices or means.

It should further be noted that the description and drawings merely illustrate the principles of the present disclosure. Those skilled in the art will be able to implement various arrangements that, although not explicitly described or shown herein, embody the principles of the invention and are included within its spirit and scope. Furthermore, all examples and embodiment outlined in the present disclosure are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

The invention claimed is:

1. A transmission arrangement for coupling an amplifier to a transmission medium, an input node of the amplifier couplable to a transmitter, an output node of the amplifier couplable to a terminal of the transmission medium, the transmission arrangement comprising:
a first branch coupled between the input node of the amplifier and an intermediate node couplable to a receiver; and
a second branch coupled between the output node of the amplifier and the intermediate node,
wherein the first branch comprises a first capacitive element;
the second branch comprises a second capacitive element; and
at least one of the first or second branches further comprises a phase matching circuit coupled in series with a respective one of the first or second capacitive element.

2. The transmission arrangement according to claim 1, wherein the phase matching circuit is configured to achieve nearly-opposite signal phases within a frequency range at the intermediate node between transmit signals passing through the first branch and the second branch.

3. The transmission arrangement according to claim 1, wherein a ratio between capacitances of the first capacitive element and the second capacitive element is determined according to a gain of the amplifier.

4. The transmission arrangement according to claim 3, wherein the at least one of the first or second branches which comprises the phase matching circuit further comprises:
a pre-amplification stage coupled between the phase matching circuit and the respective capacitive element.

5. The transmission arrangement according to claim 4, wherein the ratio between capacitances of the first capacitive element and the second capacitive element is determined further according to a gain of the pre-amplification stage.

6. The transmission arrangement according claim 1, wherein the phase matching circuit comprises a resistive element.

7. The transmission arrangement according to claim 6, wherein the phases matching circuit is comprised within the first branch and the resistive element and the first capacitive element are tunable elements.

8. The transmission arrangement according to claim 7, wherein the resistive element and the first capacitive element are tuned in accordance with one of a gain of the amplifier, a load of the amplifier, or both.

9. The transmission arrangement according to claim 1, wherein the first branch and the second branch each comprises a pair of differential signal lines for carrying a respective pair of differential signals.

10. The transmission arrangement according to claim 9, wherein each line of the pair of differential signal lines in the first branch comprises a respective first capacitive element;
each line of the pair of differential signal lines in the second branch comprises a respective second capacitive element; and
each line of the pair of differential signal lines in the at least one of the first or second branches comprises a respective phase matching circuit.

11. The transmission arrangement according to claim 9, wherein the phase matching circuit comprises an all-pass lattice filter.

12. The transmission arrangement according to claim 11, wherein the phase matching circuit is comprised within the first branch and the all-pass lattice filter comprises:
a respective resistor and a respective inductor coupled in series between the input node of the amplifier and the respective first capacitive element on each of the pair of differential signal lines; and
a respective capacitor cross-coupled between the respective first capacitive element on one differential signal line and the input node of the amplifier on the other differential signal line.

13. The transmission arrangement according to claim 12, wherein the at least one of the first or second branches which comprises the phase matching circuit further comprises:
a pre-amplification stage coupled between the phase matching circuit and the respective capacitive element.

14. The transmission arrangement according to claim 13, wherein the ratio between capacitances of the first capacitive element and the second capacitive element is determined further according to a gain of the pre-amplification stage.

15. The transmission arrangement according to claim 1, wherein the intermediate node acts as a virtual ground.

16. An integrated circuit comprising a transmission arrangement according to claim 1, wherein the integrated circuit is implemented using CMOS technologies.

17. A network node comprising a transmission arrangement according to claim 1.

* * * * *